US006841835B2

United States Patent
Miyamoto

(10) Patent No.: US 6,841,835 B2
(45) Date of Patent: Jan. 11, 2005

(54) MOS TRANSISTOR AND SWITCHING POWER SUPPLY

(75) Inventor: Hitoshi Miyamoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 27 days.

(21) Appl. No.: 10/441,678

(22) Filed: May 20, 2003

(65) Prior Publication Data

US 2003/0230766 A1 Dec. 18, 2003

(30) Foreign Application Priority Data

May 21, 2002 (JP) ........................................ 2002-002950

(51) Int. Cl.[7] .............................................. H01L 29/76
(52) U.S. Cl. ...................................... 257/391; 257/392
(58) Field of Search ......................................... 257/391

(56) References Cited

U.S. PATENT DOCUMENTS 4,937,075 A * 6/1990 Hollingsworth et al. .... 438/275
6,653,693 B1 * 11/2003 Makino ....................... 257/391

FOREIGN PATENT DOCUMENTS

| JP | 11-307650 | 11/1999 | ....... H01L/21/8234 |
| JP | 2001-36388 | 2/2001 | .......... H03K/3/037 |
| JP | 2002-16238 | 1/2002 | ......... H01L/27/108 |

* cited by examiner

Primary Examiner—Douglas Wille
(74) Attorney, Agent, or Firm—Osha & May L.L.P.

(57) ABSTRACT

MOS transistor cells 1 and MOS transistor cells 2 having different gate threshold voltages are formed on a chip 8. The MOS transistor cells 1, 2 having the different gate threshold voltages are connected in parallel.

6 Claims, 6 Drawing Sheets

MOS TRANSISTOR AND SWITCHING POWER SUPPLY

BACKGROUND OF THE INVENTION

The present invention relates to a MOS transistor in which MOS transistor cells having different gate threshold voltages are connected in parallel and also relates to a switching power supply which uses the MOS transistor as a switching element.

AMOS transistor used as a switching element etc. for a switching power supply is formed by connecting a plurality of cells in parallel in order to lower an on-resistance value thereof. FIG. 7 schematically shows the structure of the section of the cell. That is, a reference numeral 81 depicts a gate electrode formed by poly-silicon, 82 an insulation layer for insulating the gate electrode 81, 84 an N+ region, and 83 a metal layer formed by aluminum silicon etc. The metal layer is coupled to the N+ region 84 and serves as a source electrode. A reference numeral 85 depicts a P− region, 86 an N− region, 87 a N+ region and 88 a metal plate serving as a drain electrode. When a voltage is applied to the gate electrode 81, a channel 89 with a depth corresponding to the applied voltage is formed and so a current flows from the drain to the source.

The gate voltage (hereinafter called a gate threshold voltage) when the channel is formed and a current starts to flow from the drain to the source changes in accordance with the change of the thickness of the gate electrode 81. That is, when the thickness of the gate electrode 81 is made smaller, the gate threshold voltage becomes lower. In contrast, when the thickness of the gate electrode 81 is made larger, the gate threshold voltage becomes higher. Thus, the thickness of the gate electrode 81 is determined such that the gate threshold voltage becomes a desired value. The thickness of the gate electrodes is formed to be entirely same on the same chip (first conventional technique).

A conventional technique proposed in the Unexamined Japanese Patent Application Publication No-2001-36388 discloses in the description from p. 19, line 20 to p. 20, line 16 such a configuration that, as to a plurality of MOS transistor cells formed on a single chip, the gate threshold voltages thereof are set to values suited to a required condition (second conventional technique).

A conventional technique proposed in the Unexamined Japanese Patent application Publication No. Hei 11-307650 discloses that, in an IC provided with a comparator, a mobility of a load side MOS transistor is made smaller than that of a differential side MOS transistor, and a mutual conductance gm of the load side MOS transistor is made smaller than that of the differential side MOS transistor. Thus, an offset voltage of the comparator using the MOS transistor can be reduced without increasing an occupied area (third conventional technique).

A conventional technique proposed in the Unexamined Japanese Patent Application Publication No. 2002-16238 discloses that an amplitude voltage of a column selection signal can be reduced by reducing the thickness of the gate oxide film of a MOS transistor which receives the column selection signal (fourth conventional technique).

FIG. 9 shows the configuration of another conventional technique of a switching power supply which uses a MOS transistor as a switching element and performs partial resonance. That is, in this technique, a switching pulse 72 outputted from a control circuit 71 is induced to the gate of a MOS transistor 74 through a saturable inductor L7. Thus, as shown in FIG. 10, although the switching pulse 72 rises abruptly, the gate voltage increases slowly as shown by a line 73. As a result, a current for discharging electric charges accumulated in a parasitic capacity component C7 is suppressed to a small value as shown by a steady line 78 (in this respect, a dotted line 79 represents change of a current for discharging the parasitic capacity component C7 in the case where the saturable inductor L7 is not provided. Therefore, the switching loss can be reduced (fifth conventional technique).

However, when the first conventional technique is used, there arises a following problem. That is, the MOS transistor formed by connecting a plurality of the cells in parallel has a large input capacity. Thus, when a pulse is applied to the gate, the gate voltage does not increase abruptly as shown by a reference numeral 98 in FIG. 8. As a result, it takes a ling time until the gate voltage exceeds a gate threshold voltage Vth8. Supposing that the increasing rate of the gate voltage is constant, the lower the gate threshold voltage is, the faster the timing when a current starts to flow into the MOS transistor becomes. However, since the MOS transistor with a low gate threshold voltage is thin in its gate and large in its area, the input capacity thereof is large. Thus, the MOS transistor with a low gate threshold voltage is lower in the increasing speed of the gate voltage as shown by a line 97 as compared with a MOS transistor with a high gate threshold voltage (shown by the line 98). Therefore, although the gate threshold voltage is set to a small value of Vth7, the timing when a current starts to flow into the MOS transistor becomes almost same as the case of the MOS transistor with a high gate threshold voltage. Thus, in the case of making earlier or faster the timing where the MOS transistor shifts in an ON state, it is required to enhance the driving ability of a driving circuit for driving the gate.

According to the second conventional technique, the MOS transistor cells formed so that the gate threshold voltages thereof are set to satisfy the required condition is arranged in a manner that each of these cells is used as a MOS transistor by itself. Thus, when considering the second conventional technique in a view point of solving the aforesaid problem, this second conventional technique is difficult to be applied.

Further, when considering the third and fourth conventional techniques in a view point of solving the aforesaid problem, these conventional techniques are also difficult to be applied.

When the fifth conventional technique is employed, although the switching loss can be reduced, the saturable inductor L7 is required for the reduction. On the other hand, saturable inductor L7 is expensive. That is, the fifth conventional technique causes a problem that the number of parts increases and costs of the parts also increase.

SUMMARY OF THE INVENTION

Accordingly, the invention has been made in order to solve the aforesaid problems of the conventional techniques and an object of the invention is to provide a MOS transistor which can suppress the increase of an input capacity and a feedback capacity thereof even in the case of lowering its gate voltage at which a current starts to flow therethrough, prevent concentration of heat generation and suppress an on-resistance value to a relatively small value even when the gate voltage is low.

Another object of the invention is to provide a MOS transistor in which mutually different MOS transistor cells are connected in parallel so that the increase of an input capacity and a feedback capacity thereof can be suppressed even in the case of lowering its gate voltage at which a current starts to flow therethrough.

In addition to the aforesaid object, another object of the invention is to provide a MOS transistor in which low gate threshold voltage cells each of which is a MOS transistor cell with a low gate threshold voltage are formed so as to be dispersed almost uniformly on a chip thereby to prevent the concentration of heat generation.

Still another object of the invention is to provide a switching power supply in which a MOS transistor formed by arranging MOS transistor cells having respectively different gate threshold voltages in parallel is used as a switching element, and a current value is reduced upon discharge of the electric charges accumulated at a parasitic capacity component at the time where the switching element is shifted from an off state to an on state, so that an amount of heat generated by the MOS transistor caused by the discharge of the electric charges of the parasitic capacity component can be reduced.

In addition to the aforesaid object, still another object of the invention is to provide a witching power supply in which an element, formed in a manner that low gate threshold voltage cells are formed so as to be dispersed almost uniformly on a chip, is used as a MOS transistor for performing a switching operation, so that the increase of failure rate can be prevented.

In addition to the aforesaid object, still another object of the invention is to provide a witching power supply in which an element, formed in a manner that the number of low gate threshold voltage cells is in a range of 1/10 to 1/2 of the number of high gate threshold voltage cells, is used as a MOS transistor for performing a switching operation, so that a suitable switching operation can be performed.

In order to solve the aforesaid problems, a MOS transistor according to the invention is arranged in a manner that low gate threshold voltage cells each of which is a MOS transistor cell which gate threshold voltage is lower one of two kinds of voltages and high gate threshold voltage cells each of which is a MOS transistor cell which gate threshold voltage is higher one of the two kinds of voltages are formed on a chip, the low gate threshold voltage cells and the high gate threshold voltage cells are connected in parallel, and a number of the low gate threshold voltage cells is in a range of 1/10 to 1/2 of a number of the high gate threshold voltage cells.

That is, the input capacity and the feedback capacity of each of the low gate threshold voltage cells are large, whilst the input capacity and the feedback capacity of each of the high gate threshold voltage cells are small. Thus, as compared with the input capacity and the feedback capacity when all the MOS transistor cells are formed by the low gate threshold voltage cells, the input capacity and the feedback capacity are reduced in accordance with the number of the high gate threshold voltage cells. Further, as to a ratio of the number of the lowgate threshold voltage cells with respect to the number of the high gate threshold voltage cells, when the ratio is set to a small value, although each of the input capacity and the feedback capacity becomes small, the value of an on-resistance when only the low gate threshold voltage cells are turned on becomes large. In contrast, when the ratio is set to a large value, although the value of the on-resistance when only the low gate threshold voltage cells are turned on becomes small, each of the input capacity and the feedback capacity becomes large. Thus, when the ratio is set in a range of 1/10 to 1/2, the increase of each of the input capacity and the feedback capacity can be suppressed while suppressing the increase of the value of the on-resistance when only the low gate threshold voltage cells are turned on. Further, the timing where a current starts to flow into the low gate threshold voltage cells is earlier than the timing where a current starts to flow into the high gate threshold voltage cells. Thus, a heat amount of each of the low gate threshold voltage cells is larger than that of each of the high gate threshold voltage cells. However, the low gate threshold voltage cells, a heat amount generated from each of which is large, are formed so as to be dispersed almost uniformly on the chip.

A MOS transistor according to the invention is arranged in a manner that each of MOS transistor cells with different gate threshold voltages is provided plural, all the MOS transistor cells with different gate threshold voltages are formed on a chip, and the MOS transistor cells with different gate threshold voltages are connected in parallel.

That is, the input capacity and the feedback capacity of each of the low gate threshold voltage cells are large, whilst the input capacity and the feedback capacity of each of the high gate threshold voltage cells are small. Thus, as compared with the input capacity and the feedback capacity when all the MOS transistor cells are formed by the low gate threshold voltage cells, the input capacity and the feedback capacity are reduced in accordance with the number of the high gate threshold voltage cells.

In addition to the aforesaid configuration, the MOS transistor cells with different gate threshold voltages include low gate threshold voltage cells each of which is a MOS transistor cell which gate threshold voltage is lower one of two kinds of voltages and high gate threshold voltage cells each of which is a MOS transistor cell which gate threshold voltage is higher one of the two kinds of voltages, and the low gate threshold voltage cells are formed in such a positional relation that the low gate threshold voltage cells are dispersed almost uniformly on the chip.

That is, the timing where a current starts to flow into the low gate threshold voltage cells is earlier than the timing where a current starts to flow into the high gate threshold voltage cells. Thus, a heat amount generated from each of the low gate threshold voltage cells is larger than that of each of the high gate threshold voltage cells. However, the low gate threshold voltage cells, a heat amount generated from each of which is large, are formed so as to be dispersed almost uniformly on the chip.

A switching power supply according to the invention is arranged in a manner that in the switching power supply for switching current flowing through a primary coil by using a MOS transistor, wherein the MOS transistor is arranged in a manner that each of MOS transistor cells with different gate threshold voltages is provided plural, all the MOS transistor cells with different gate threshold voltages are formed on a chip, and the MOS transistor cells with different gate threshold voltages are connected in parallel. That is, the discharge of a parasitic capacity component occurs in a region where the on-resistance is a preferable value. Therefore, electric power to be dissipated for discharging the electric charges of the parasitic capacity component becomes small.

In addition to the aforesaid configuration, in the MOS transistor, the MOS transistor cells with different gate threshold voltages include low gate threshold voltage cells each of which is a MOS transistor cell which gate threshold voltage is lower one of two kinds of voltages and high gate threshold voltage cells each of which is a MOS transistor cell which gate threshold voltage is higher one of the two kinds of voltages, and the low gate threshold voltage cells are formed in such a positional relation that the low gate threshold voltage cells are dispersed almost uniformly on the chip. That is, heat generated by the MOS transistor for performing the switching operation is not concentrated at a particular portion on the chip.

In addition to the aforesaid configuration, in the MOS transistor, the number of the low gate threshold voltage cells is in a range of ⅟₁₀ to ½ of the number of the high gate threshold voltage cells. That is, the electric charges accumulated at the parasitic capacity component is discharged with the on-resistance of a preferable value.

DETAILED DESCRIPTION OF THE PREFERRED EMBODIMENTS

The embodiments of the invention will be explained with reference to the accompanying drawings.

Figure 2:
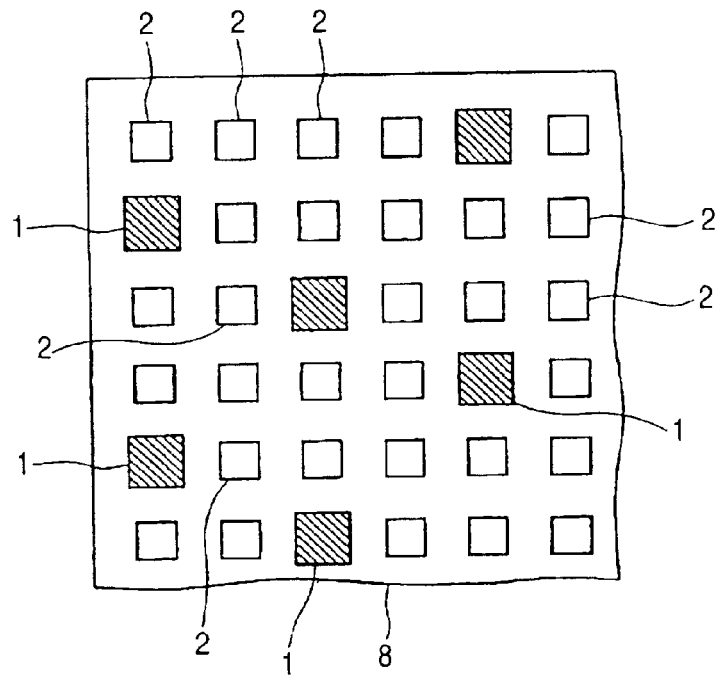
FIG. 2 is an explanatory diagram showing the arrangement of low gate threshold voltage cells and high gate threshold voltage cells.

FIG. 2 is an explanatory diagram showing the arrangement of MOS transistor cells of the embodiment of a MOS transistor according to the invention.

In the figure, MOS transistor cells each having a gate threshold voltage of 2 volt (low gate threshold voltage cell) 1, - - - and MOS transistor cells each having a gate threshold voltage of 5 volt (high gate threshold voltage cell) 2, - - - are formed on a chip 8. The low gate threshold voltage cells 1, - - - are formed in such a positional relation that they are dispersed almost uniformly on the chip 8. The number of the low gate threshold voltage cells 1, - - - is almost ⅙ of the number of the high gate threshold voltage cells 2, - - - .

Figure 1:
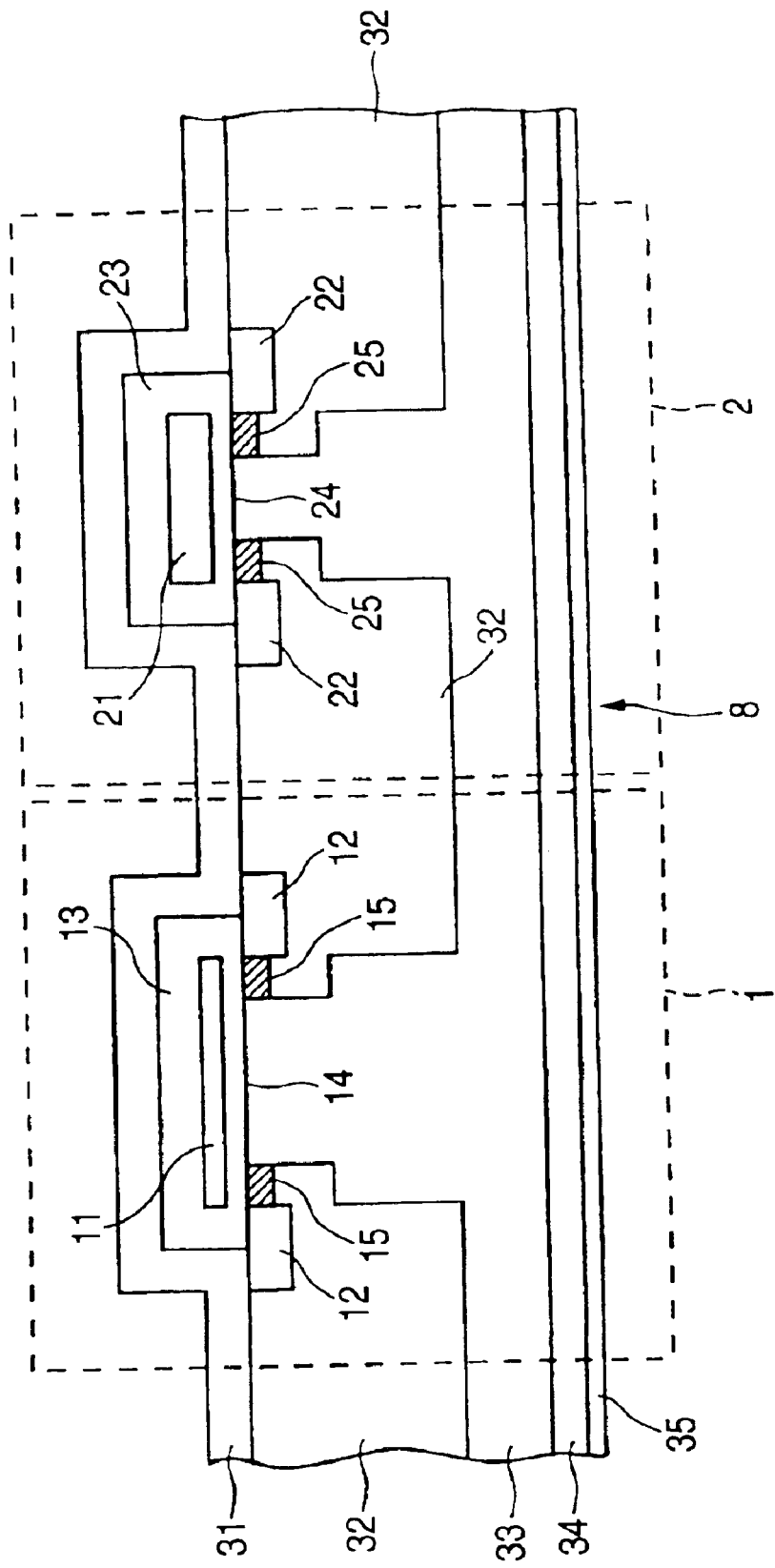
FIG. 1 is an explanatory diagram for schematically showing the sectional configuration of MOS transistor cells of an embodiment of a MOS transistor according to the invention.

FIG. 1 is an explanatory diagram for schematically showing sections of the low gate threshold voltage cell and the high gate threshold voltage cell.

A metal plate 35 serving as a drain electrode is jointed to an N+ layer 34 formed on the rear surface side of the chip 8. An N− region 33 is formed on the major surface side of the N+ layer 34 so as to oppose to the metal plate 35 through the N+ layer 34. A P− region 32 is formed so as to enter into the N− region 33. N+ regions 12, 22 are formed so as to extend along the edges of gate electrodes 11, 21, each having a square shape in a plan view, on the major surface side of the P− region 32, respectively. Oxide films 14, 24 are formed on the major surface side of the N− region 33. The gate electrodes 11, 21 made of poly-silicon are formed in a manner that these electrodes are insulated by insulation layers 13, 23, respectively. Thus, when a voltage is applied to each of the gate electrodes 11, 21, channels 15, 25 with thickness corresponding to the applied voltages are formed, respectively, and so a current flows between the N− region 33 and the N+ regions 12, 22.

A metal film 31 made of aluminum-silicon is formed on the major surface of the chip 8. The metal film 31 is formed so as to be electrically connected to the N+ regions 12, 22 and serves as a source electrode. The gate electrodes 11, 21 are coupled to each other through a not-shown metal film. That is, all of the low gate threshold voltage cells 1, - - - and the high gate threshold voltage cells 2, - - - shown in FIG. 2 are connected in parallel.

Since the gate threshold voltage is 2 volt, the thickness of the gate electrode 11 is made smaller than the thickness of the gate electrode 21 having the gate threshold voltage of 5 volt. That is, the thickness of the gate electrode 11 differs from that of the gate electrode 21. Thus, the gate electrodes 11, 21 are formed by two processes, that is, a process of forming the gate electrode 11 and a process of forming the gate electrode 21.

Further, since the thickness of the gate electrode 21 is made larger than the thickness of the gate electrode 11, an area in a plan view of the gate electrode 21 is made smaller than that of the gate electrode 11. Thus, when considering the MOS transistor cell as a single unit, the input capacitance (Ciss) of the high gate threshold voltage cell 2 is smaller than the input capacitance of the low gate threshold voltage cell 1. Further, the feedback capacity (Crss) of the high gate threshold voltage cell 2 is also made smaller than that of the low gate threshold voltage cell 1.

As explained above, the number of the low gate threshold voltage cells 1, - - - is almost ⅙ of the number of the high gate threshold voltage cells 2, - - - . Thus, the input capacity and the feedback capacity are almost same as those of the MOS transistor with the gate threshold voltage of 5 volt. Therefore, when this embodiment is considered as a MOS transistor with the gate threshold voltage of 2 volt, the input capacity and the feedback capacity are set to quite small values.

This embodiment is set in a manner that a resistance value between the drain and the source is 1.5Ω when all the high gate threshold voltage cells 2, - - - and the low gate threshold voltage cells 1, - - - are in an on state. Further, since the number of the low gate threshold voltage cells 1, - - - is almost ⅙ of the number of the high gate threshold voltage cells 2, - - - , when only the low gate threshold voltage cells 1, - - - are in an on state, the resistance value between the drain and the source becomes a relatively low value of about 10Ω.

Action of the embodiment configured in the aforesaid manner will be explained with reference to FIG. 4.

In the case where the gate voltage is increased from 0 volt, when the gate voltage starts to exceed the gate threshold voltage Vth1 of the low gate threshold voltage cells 1, - - - , a channel 15 is formed in the low gate threshold voltage cells 1, - - - . Thus, the resistance value between the drain and the source reduces along a hyperbolic curve with a asymptotic line of 10Ω in correspondence to the increase of the gate voltage as shown by a steady line 55. Then, when the gate voltage starts to exceed the gate threshold voltage Vth2 of the high gate threshold voltage cells 2, - - - , a channel 25 is also formed in the high gate threshold voltage cells 2, - - - . Thus, the resistance value between the drain and the source reduces along a hyperbolic curve with a asymptotic line of 1.5Ω in correspondence to the increase of the gate voltage as shown by a steady line 56.

On the other hand, when notifying the timing where a current starts to flow, the timing where a current starts to flow into the low gate threshold voltage cells 1, - - - is earlier than the timing where a current starts to flow into the high gate threshold voltage cells 2, - - - . Thus, when considering a heat amount of the MOS transistor cell as a single unit, a heat amount of each of the low gate threshold voltage cells 1, - - - is larger than that of each of the high gate threshold voltage cells 2, - - - . However, the low gate threshold voltage cells 1, - - - are formed so as to be dispersed almost uniformly on the chip 8. Thus, the temperature increase does not occur concentrically at a portion of the chip 8 but occurs uniformly at the chip. That is, the partial excessive increase of the temperature is prevented from occurring at the chip 8.

Figure 3:
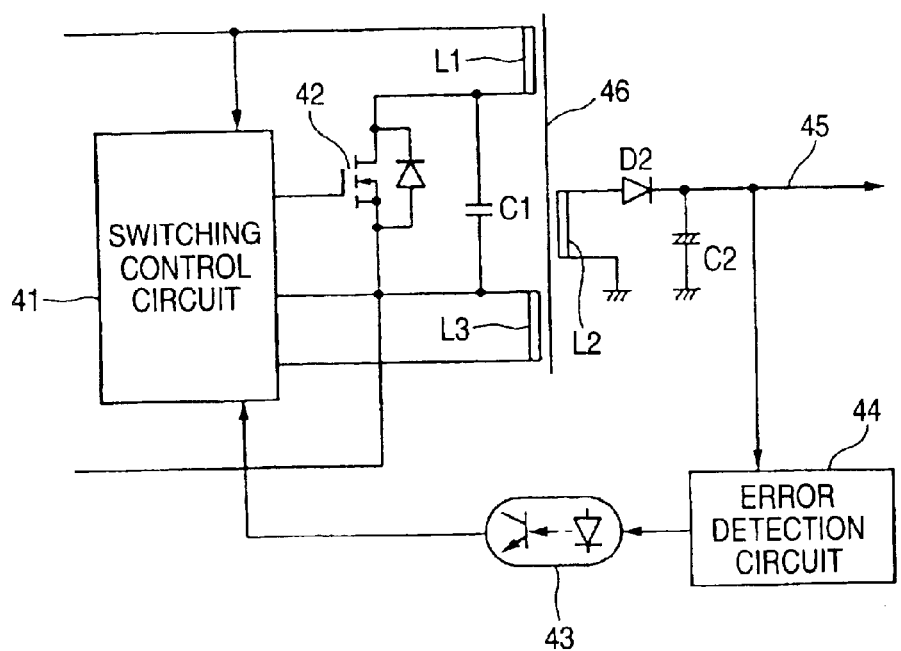
FIG. 3 is a block diagram showing the electrical configuration of the embodiment of the switching power supply according to the invention.

FIG. 3 is a block diagram showing the electrical configuration of the embodiment of the switching power supply according to the invention and shows a RCC type switching power supply.

A MOS transistor 42 for switching a current flowing through the primary coil L1 is a MOS transistor formed by connecting the low gate threshold voltage cells 1, - - - and the high gate threshold voltage cells 2, - - - in parallel, as explained in its configuration above. A diode D2 and a capacitor C2 constitute a rectifying and smoothing circuit which rectifies and smoothes the output of the secondary coil L2 to generate a DC output 45. An error detection circuit 44 constitutes a block which detects the error voltage of the DC output 45 and feeds back the detected error voltage to a switching control circuit 41 through a photo coupler 43.

The switching control circuit 41 is a block having a control transistor etc. which controls, based on an error voltage signal thus fed back, a level of a signal which is outputted from the drive coil L3 and applied to the gate of the MOS transistor 42. Thus, the MOS transistor 42 performs the switching operation based on the error voltage signal, whereby the voltage of the DC output 45 is stabilized to a predetermined value. Incidentally, a capacitor C1 represents a parasitic capacity component (including the output capacity of the MOS transistor 42) generated at a path connected to the drain of the MOS transistor 42.

The operation of the embodiment thus configured will be explained.

The switching control circuit 41 controls the gate voltage at the time point where the MOS transistor 42 is turned on, based on the voltage generated at the drive coil L3 and the error voltage signal introduced through the photo coupler 43. Thus, the MOS transistor 42 performs the switching operation so that the voltage of the DC output 45 becomes the predetermined value.

Figure 5:
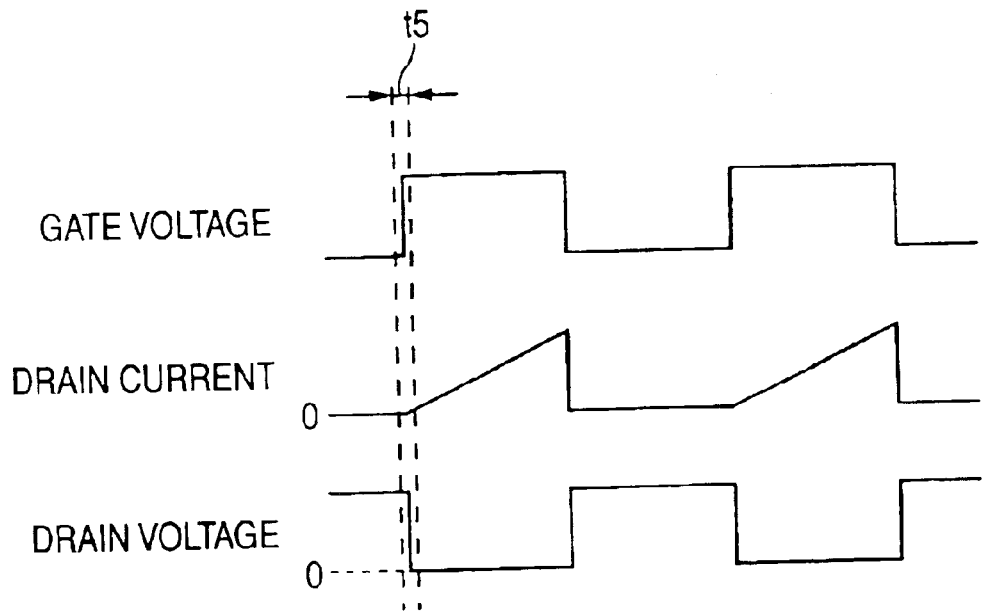
FIG. 5 is an explanatory diagram showing waveforms of major signals at the time of switching operation.

FIG. 5 schematically shows changes of the gate voltage, the drain current and the drain voltage when the MOS transistor 42 performs the aforesaid switching operation. That is, when the gate voltage reaches a value for turning the MOS transistor 42 on, the drain current increases temporarily. The drain current at this time is almost 0 volt. Then, when the drain current increases to a value corresponding to the error voltage signal, the gate voltage becomes 0 volt and so the MOS transistor 42 shifts from an on state to an off state (at this time, the drain voltage becomes almost twice the primary side input voltage). When the emission of energy accumulated at the transformer 46 is completed, the MOS transistor 42 shifts from an off state to an on state. Thereafter, the similar operation is repeated.

Figure 4:
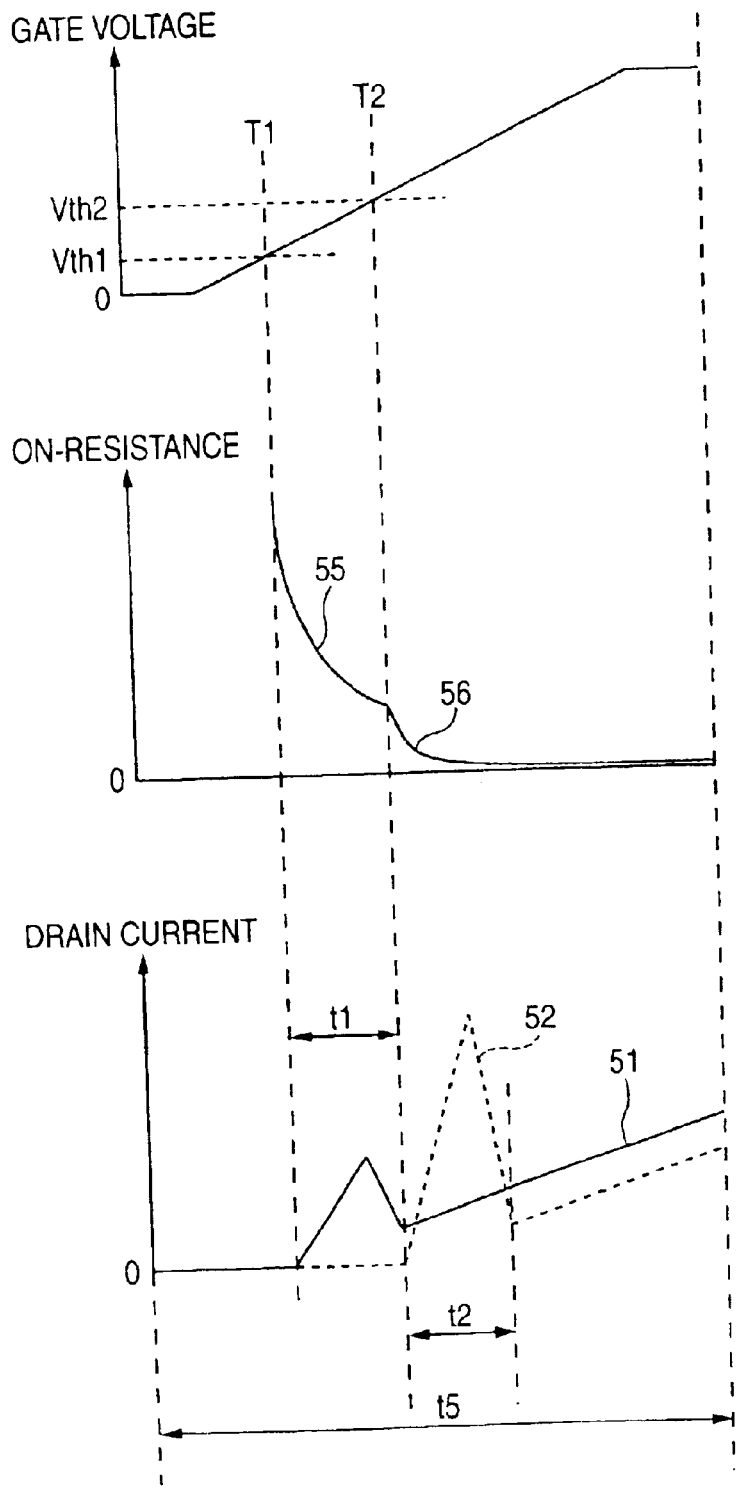
FIG. 4 are explanatory diagrams showing a relation among the gate voltage, the on-resistance and the drain current of the MOS transistor used in the switching power supply.

FIG. 4 is enlarged diagrams showing a time period t5 at which the MOS transistor 42 shifts to an on state. That is, when the gate voltage starts to increase from 0 volt and exceeds the gate threshold voltage Vth1 of the low gate threshold voltage cells 1, - - - (time T1), a current starts to flow only into the low gate threshold voltage cells 1, - - - . Thus, hereinafter, the on-resistance of the transistor decreases along a hyperbolic curve with a asymptotic line of 10Ω. Therefore, during a time period from a time point where the gate voltage exceeds the gate threshold voltage Vth1 to a time point where the gate voltage exceeds the gate threshold voltage Vth2, the current flows in a high on-resistance state. When the current starts to flow into the MOS transistor 42, the electric charges accumulated in the parasitic capacity component C1 is discharged due to the partial resonance. Thus, the drain current changes as shown by a steady line 51.

Supposing that the MOS transistor 42 is formed only by the high gate threshold voltage cells 2, - - - like the conventional technique, the current starts to flow when the gate voltage exceeds the gate threshold voltage Vth2. Thus, in this case, the drain current changes as shown by the dotted line 52.

Supposing that the drain current changes as shown by the steady line 51, and also supposing that the average value of the on-resistance during the time period t1 where the electric charges of the parasitic capacity component C1 is discharged is r1 and the voltage between the both terminals of the parasitic capacity component C1 is V, the average value i1 of the drain current is represented by i1=V/r1. Thus, an electric power W1 dissipated by the MOS transistor 42 during the period t1 is represented by W1=i1×i1×r1=V×V/r1.

On the other hand, in the case where the drain current changes as shown by the dotted line 52, supposing that the average value of the on-resistance during a time period t2 where the electric charges of the parasitic capacity component C1 is discharged is r2 and the voltage between the both terminals of the parasitic capacity component C1 is V, the average value i2 of the drain current is represented by i2=V/r2. Thus, an electric power W2 dissipated by the MOS transistor 42 during the period t2 is represented by W2=i2×i2×r2=V×V/r2.

Further, since r1 represents the average value of the on-resistance of the low gate threshold voltage cells 1, - - - and r2 represents the average value of the on-resistance in the case where all of the MOS transistor cells are formed by the high gate threshold voltage cells 2, - - - , these average values satisfy the relation of r1>r2. Thus, the heat amount of the MOS transistor 42 during the time period t1 is smaller than that of the MOS transistor 42 during the time period t2. That is, the heat generation of the MOS transistor 42 caused by the discharge of the electric charges of the parasitic capacity component C1 can be suppressed.

Incidentally, as to a ratio of the number of the low gate threshold voltage cells 1, - - - with respect to the number of the high gate threshold voltage cells 2, - - - , when the ratio is set to a small value, although each of the input capacity and the feed back capacity becomes small, the value of the on-resistance when only the low gate threshold voltage cells 1, - - - are turned on becomes large. In contrast, when the ratio is set to a large value, although the value of the on-resistance when only the low gate threshold voltage cells 1, - - - are turned on becomes small, each of the input capacity and the feedback capacity becomes large. Thus, the ratio is not limited to about ⅙. That is, when the ratio is set in a range of ⅒ to ½, the increase of each of the input capacity and the feedback capacity can be suppressed while suppressing the increase of the value of the on-resistance when only the low gate threshold voltage cells 1, - - - are turned on.

Figure 6:
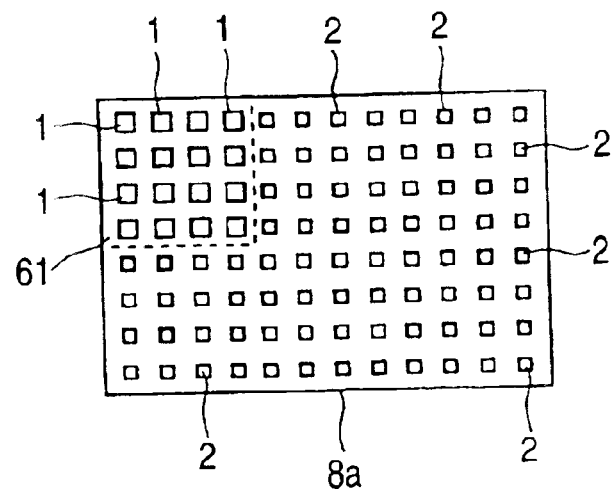
FIG. 6 is an explanatory diagram showing another arrangement method of the low gate threshold voltage cells and the high gate threshold voltage cells.
Figure 7:
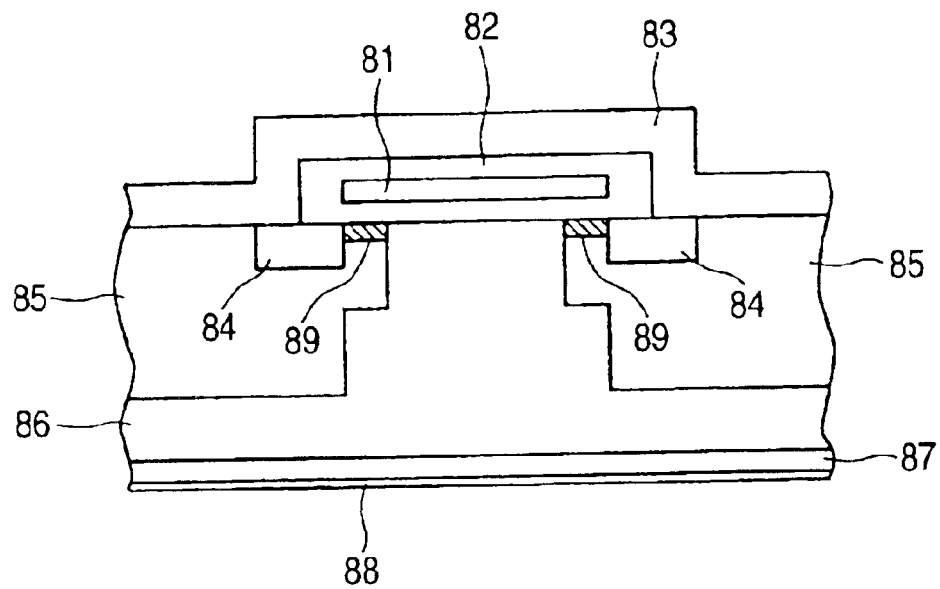
FIG. 7 is an explanatory diagram for schematically showing the sectional configuration of a MOS transistor according to a conventional technique.
Figure 8:
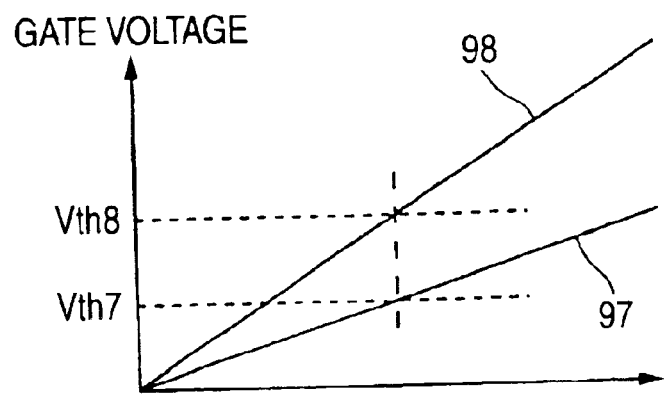
FIG. 8 is an explanatory diagram showing the changes of the gate voltage of the MOS transistor according to the conventional technique.
Figure 9:
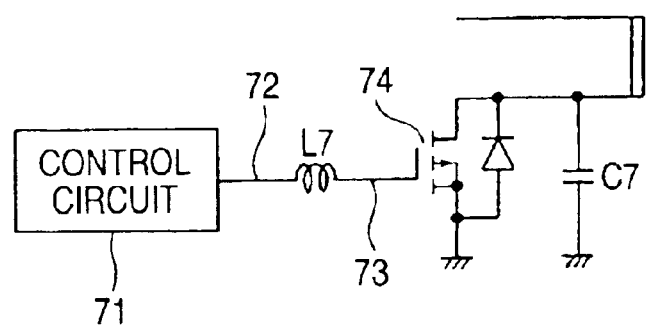
FIG. 9 is a block diagram showing the electric configuration of a switching power supply according to the conventional technique.
Figure 10:
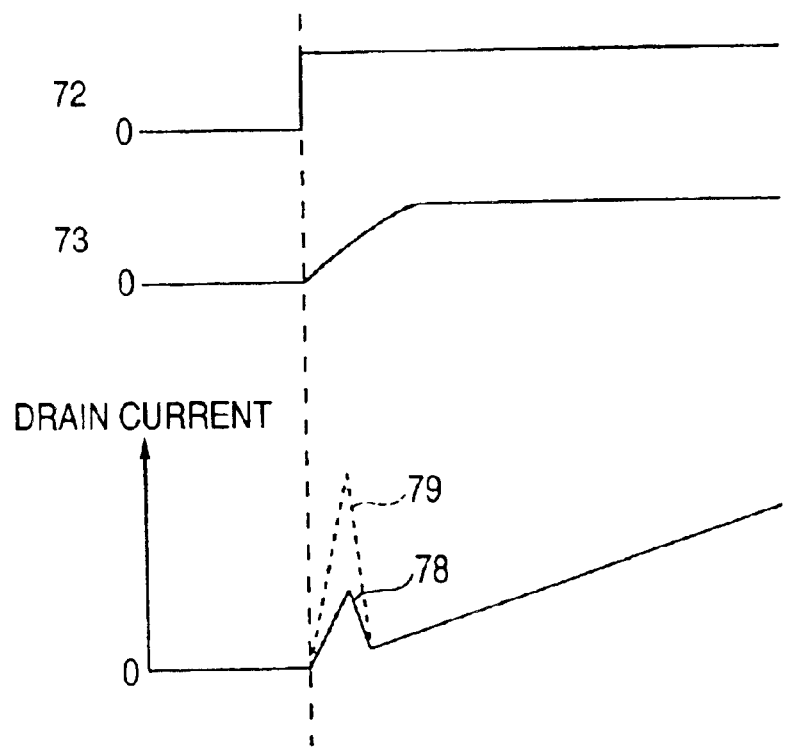
FIG. 10 is an explanatory diagram showing the change of a drain current upon switching operation.

The position on the chip where the low gate threshold voltage cells 1, - - - are formed is not limited to the position shown in FIG. 2, and maybe concentrically formed in a range 61 on the chip 8a as shown in FIG. 6.

As described above, according to the invention, the low gate threshold voltage cells and the high gate threshold voltage cells are formed and connected in parallel, and the number of the low gate threshold voltage cells is set in a range of ⅒ to ½ of the number of the high gate threshold voltage cells. Thus, the input capacity and the feedback capacity are reduced in accordance with the number of the high gate threshold voltage cells. Further, when the ratio is set in a range of ⅒ to ½, the increase of each of the input capacity and the feedback capacity can be suppressed while suppressing the increase of the value of the on-resistance when only the low gate threshold voltage cells are turned on. Further, the low gate threshold voltage cells, a heat amount generated from each of which is large, are formed so as to be dispersed almost uniformly on the chip. Thus, even when the gate voltage for starting the current to flow is made low, the increase of the input capacity and the feedback capacity can be suppressed and the concentration of heat generation can be prevented. Further, the on-resistance value can be suppressed to a relatively low value even when the gate voltage is low.

Further, according to the invention, each of the MOS transistor cells with different gate threshold voltages is provided plural, all the MOS transistor cells with different gate threshold voltages are formed on the chip, and the MOS transistor cells with different gate threshold voltages are connected in parallel. Thus, the voltage at which the current starts to flow is equal to the gate threshold voltage of the MOS transistor cells with the low gate threshold voltage. Further, since the input capacity and the feedback capacity reduce in accordance with the ratio of the number of the high gate threshold voltage cells with respect to the number of the low gate threshold voltage cells, the increase of the input capacity and the feedback capacity can be suppressed even when the gate voltage for starting the current to flow is made low.

Further, the MOS transistor cells with different gate threshold voltages include the low gate threshold voltage cells each of which is the MOS transistor cell which gate threshold voltage is lower one of the two kinds of voltages and the high gate threshold voltage cells each of which is the MOS transistor cell which gate threshold voltage is higher one of the two kinds of voltages, and the low gate threshold voltage cells are formed in such a positional relation that the low gate threshold voltage cells are dispersed almost uniformly on the chip. That is, since the low gate threshold voltage cells, a heat amount generated from each of which is large, are formed so as to be dispersed almost uniformly on the chip, concentration of heat generation can be prevented.

Further, according to the invention, in the switching power supply for switching current flowing through the primary coil by using the MOS transistor, each of the MOS transistor cells with different gate threshold voltages is provided plural, all the MOS transistor cells with different gate threshold voltages are formed on the chip, and the MOS transistor cells with different gate threshold voltages are connected in parallel. Thus, the discharge of the parasitic capacity component occurs in the region where the on-resistance is a preferable value. Therefore, since electric power to be dissipated for discharging the electric charges of the parasitic capacity component becomes small, an amount of heat generated by the MOS transistor caused by the discharge of the electric charges of the parasitic capacity component can be reduced.

Furthermore, in the MOS transistor for performing the switching operation, the low gate threshold voltage cells are formed in such a positional relation that the low gate threshold voltage cells are dispersed almost uniformly on the chip. Thus, heat generated by the MOS transistor for performing the switching operation is not concentrated at a particular portion on the chip. Therefore, since the element is hardly broken, the increase of failure rate can be prevented.

Furthermore, in addition to the aforesaid configuration, in the MOS transistor, the number of the low gate threshold voltage cells is in the range of ⅒ to ½ of the number of the high gate threshold voltage cells. Thus, the electric charges accumulated at the parasitic capacity component is discharged with the on-resistance of a preferable value, so that a preferable switching operation can be performed.

What is claimed is:

1. A MOS transistor comprising:
   a plurality of low gate threshold voltage cells each of which is a MOS transistor cell which gate threshold voltage is lower one of two kinds of voltages, and
   a plurality of high gate threshold voltage cells each of which is a MOS transistor cell which gate threshold voltage is higher one of the two kinds of voltages are formed on a chip, wherein
   the low gate threshold voltage cells and the high gate threshold voltage cells are connected in parallel, and
   a number of the low gate threshold voltage cells is in a range of ⅒ to ½ of a number of the high gate threshold voltage cells.

2. A MOS transistor comprising:
   a chip, and
   each of MOS transistor cells with different gate threshold voltages provided in plural, wherein
   all the MOS transistor cells with different gate threshold voltages are formed on the chip, and
   the MOS transistor cells with different gate threshold voltages are connected in parallel.

3. The MOS transistor according to claim 2, wherein
   the MOS transistor cells with different gate threshold voltages include;
   low gate threshold voltage cells each of which is a MOS transistor cell of which gate threshold voltage is lower one of two kinds of voltages, and
   high gate threshold voltage cells each of which is a MOS transistor cell of which gate threshold voltage is higher one of the two kinds of voltages,
   the low gate threshold voltage cells being formed in such a positional relation that the low gate threshold voltage cells are dispersed almost uniformly on the chip.

4. A switching power supply for switching current flowing through a primary coil by using a MOS transistor, comprising:

the MOS transistor arranged in a manner that each of MOS transistor cells with different gate threshold voltages is provided plural, all the MOS transistor cells with different gate threshold voltages formed on a chip, wherein the MOS transistor cells with different gate threshold voltages are connected in parallel.

5. The switching power supply according to claim 4, wherein the MOS transistor cells with different gate threshold voltages include;

low gate threshold voltage cells each of which is a MOS transistor cell of which gate threshold voltage is lower one of two kinds of voltages, and high gate threshold voltage cells each of which is a MOS transistor cell of which gate threshold voltage is higher one of the two kinds of voltages, wherein the low gate threshold voltage cells are formed in such a positional relation that the low gate threshold voltage cells are dispersed almost uniformly on the chip.

6. The switching power supply according to claim 5, wherein a number of the low gate threshold voltage cells is in a range of 1/10 to 1/2 of a number of the high gate threshold voltage cells.

* * * * *